United States Patent [19]

Wakai et al.

[11] Patent Number: 5,003,356

[45] Date of Patent: Mar. 26, 1991

[54] THIN FILM TRANSISTOR ARRAY

[75] Inventors: Haruo Wakai, Fussa; Nobuyuki Yamamura, Hachioji; Syunichi Sato, Kawagoe; Minoru Kanbara, Hachioji, all of Japan

[73] Assignee: Casio Computer Co., Ltd., Tokyo, Japan

[21] Appl. No.: 503,268

[22] Filed: Apr. 2, 1990

Related U.S. Application Data

[63] Continuation-in-part of Ser. No. 241,304, Sep. 7, 1988, abandoned.

[30] Foreign Application Priority Data

Sep. 9, 1987 [JP] Japan .................................. 62-225819
Sep. 25, 1987 [JP] Japan .................................. 62-241607
Oct. 1, 1987 [JP] Japan .................................. 62-248878

[51] Int. Cl.⁵ .................. H01L 27/12; H01L 27/00; H01L 27/01; G02F 1/13
[52] U.S. Cl. ........................................ 357/4; 357/23.7; 357/71; 357/2; 350/334; 350/336
[58] Field of Search .................. 357/4, 23.7, 71, 2; 350/334, 336

[56] References Cited

U.S. PATENT DOCUMENTS 3,765,747 10/1973 Pankratz .
3,840,695 10/1974 Fischer .
3,862,360 1/1975 Dill .
4,821,092 4/1989 Noguchi ........................... 357/23.7

FOREIGN PATENT DOCUMENTS 16-8172 4/1941 Japan .
19-5572 2/1944 Japan .
55-32026 3/1980 Japan .
57-20778 2/1982 Japan .
58-21784 2/1983 Japan .

Primary Examiner—Rolf Hille
Assistant Examiner—Mahshid Saadat
Attorney, Agent, or Firm—Frishauf, Holtz, Goodman & Woodward

[57] ABSTRACT

A TFT array having a plurality of gate lines and a plurality of drain lines formed on a transparent substrate. The gate lines intersect with the drain lines. TFT are formed at the intersections of the gate lines and the drain lines. An insulating film is formed on the drain lines and the drain electrodes of the TFTs. Pixel electrodes are formed, each overlapping the corresponding gate line and the corresponding drain line. The pixel electrode has a large area and thus, have a high opening ratio. The TFT array can, therefore, help to provide a liquid crystal display having high contrast.

3 Claims, 14 Drawing Sheets

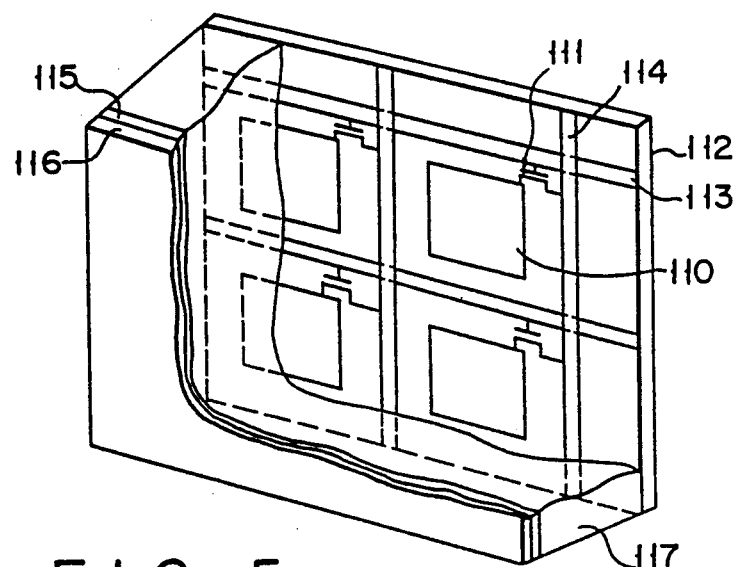
F I G. 5
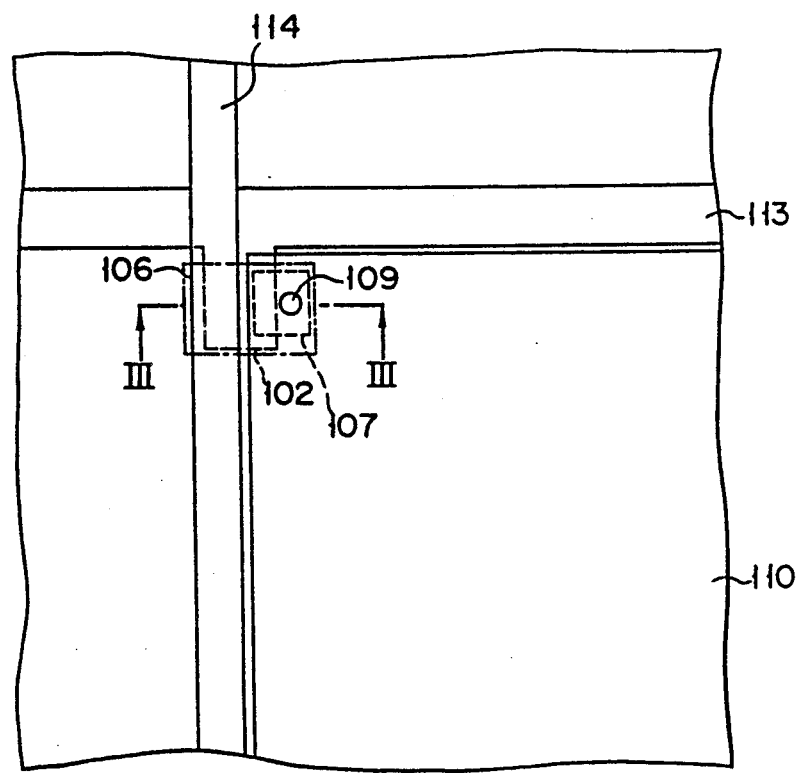
F I G. 6

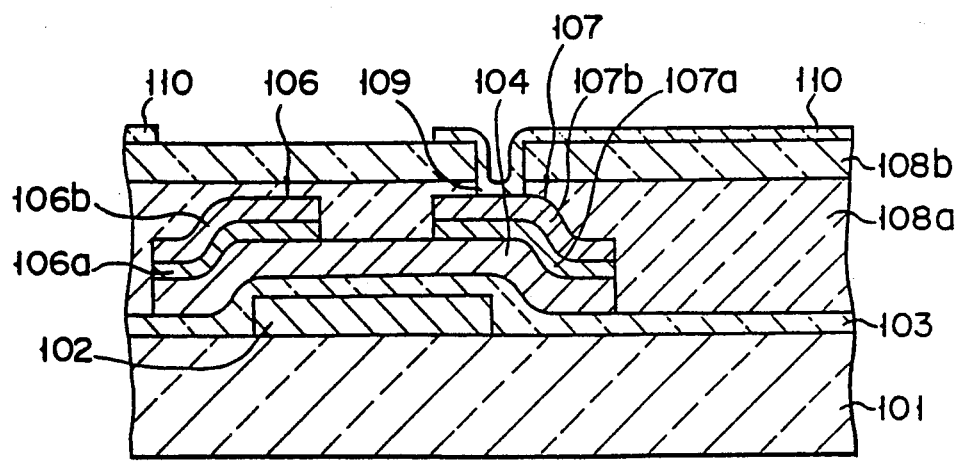
F I G. 7
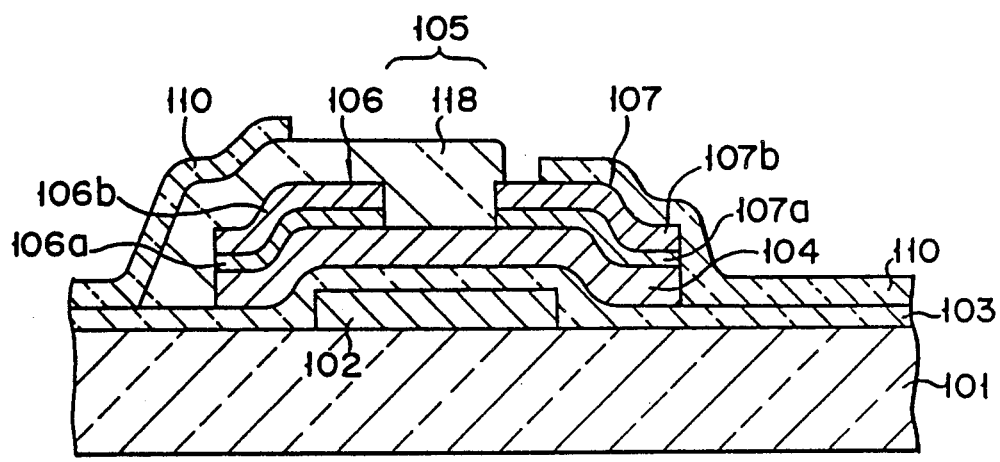
F I G. 8

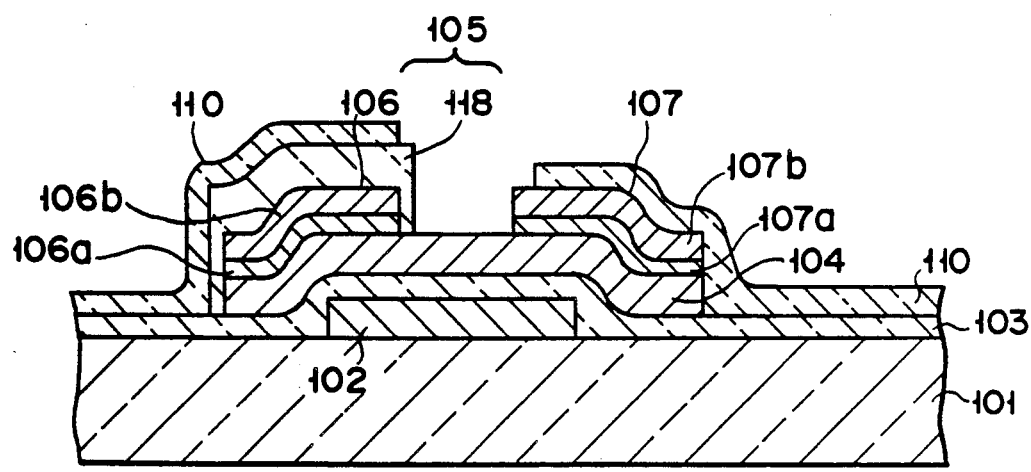
F I G. 10

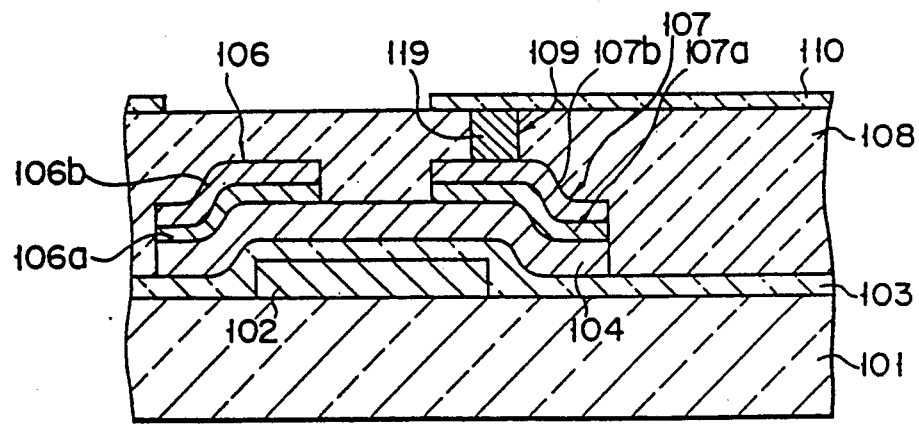
F I G. 11
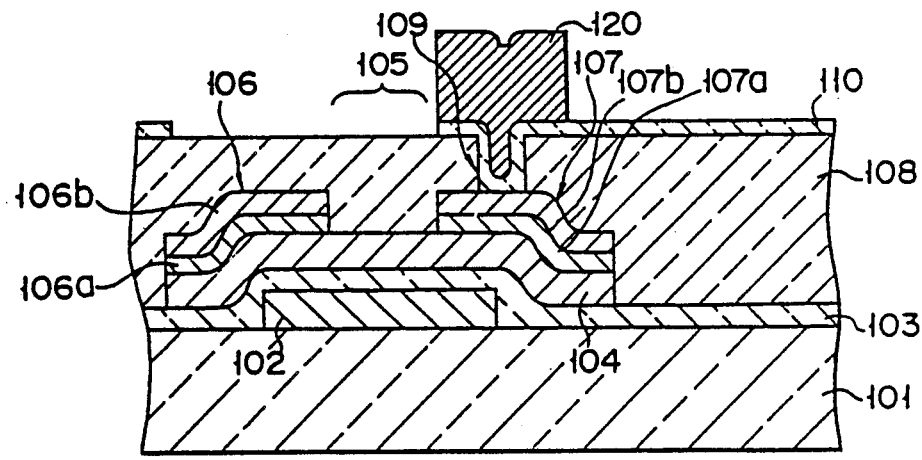
F I G. 12
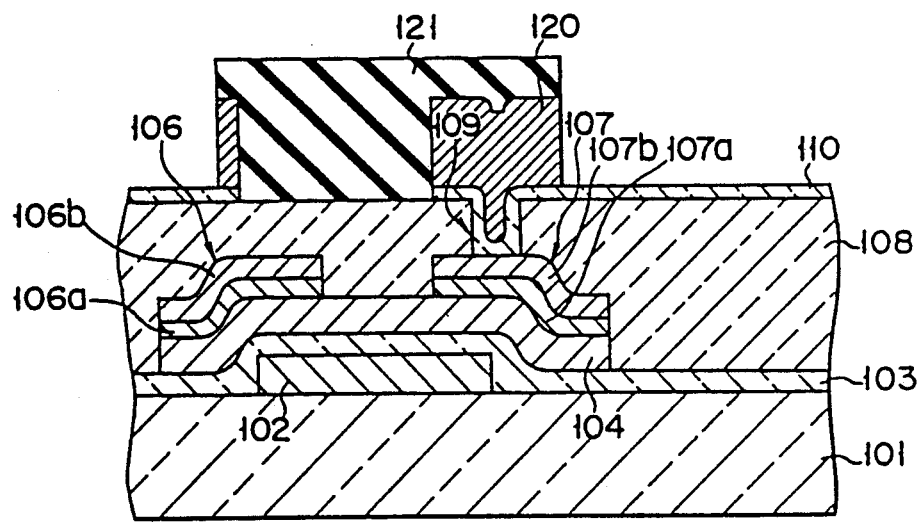
F I G. 13

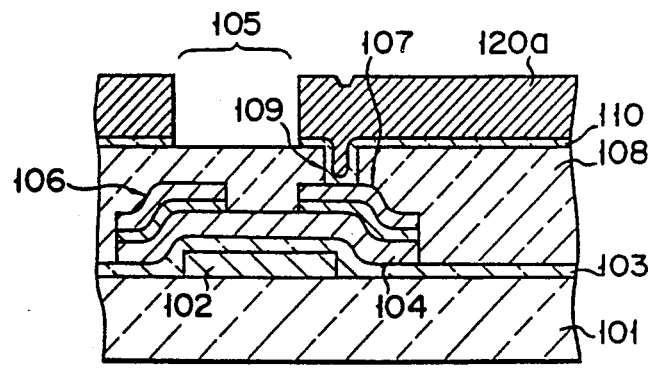
F I G. 14A
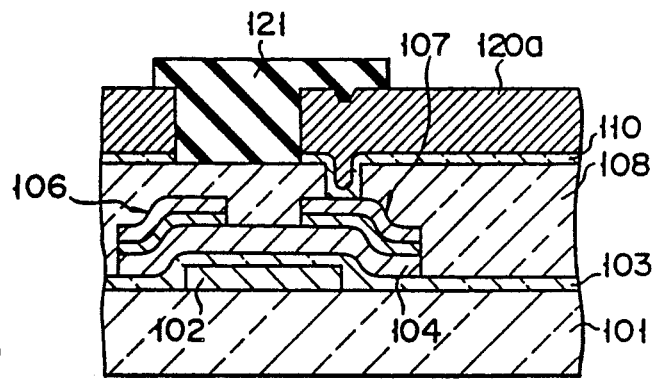
F I G. 14B
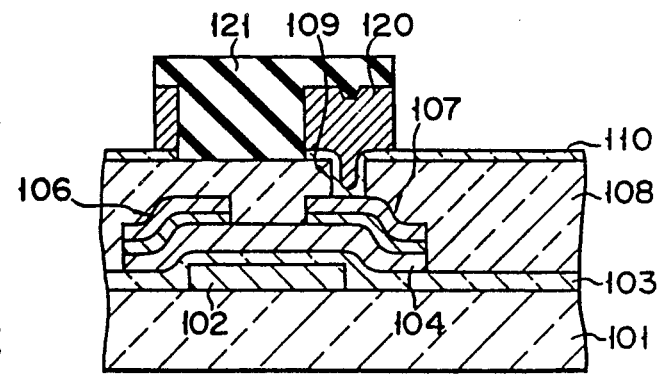
F I G. 14C

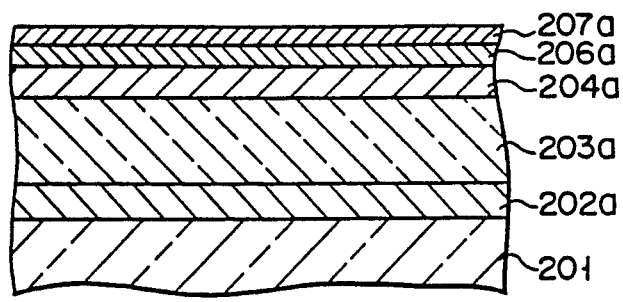
F I G. 15A
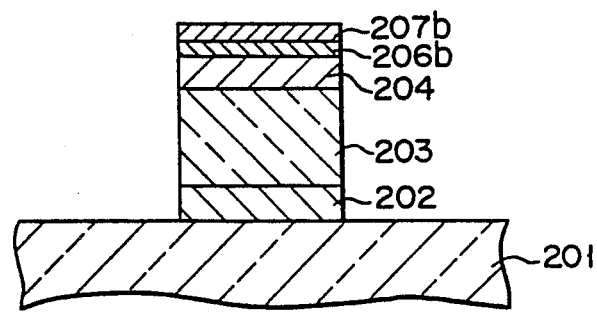
F I G. 15B
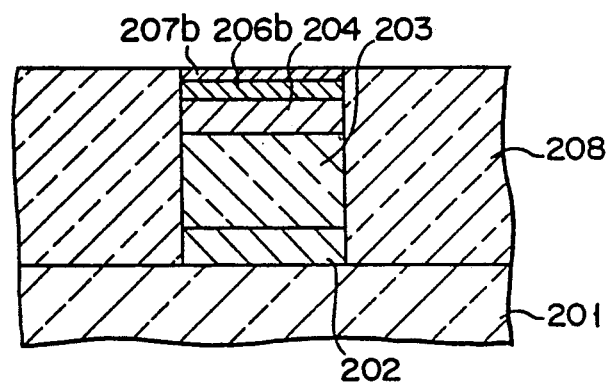
F I G. 15C
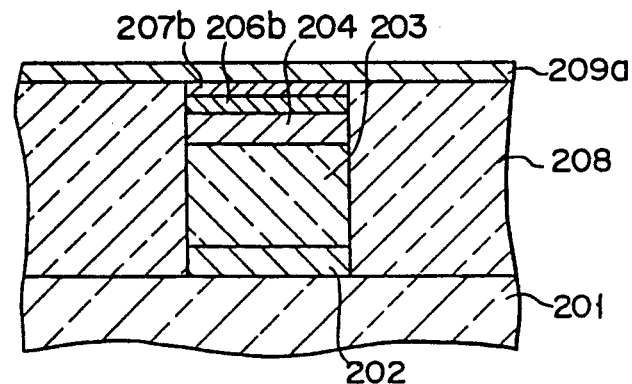
F I G. 15D

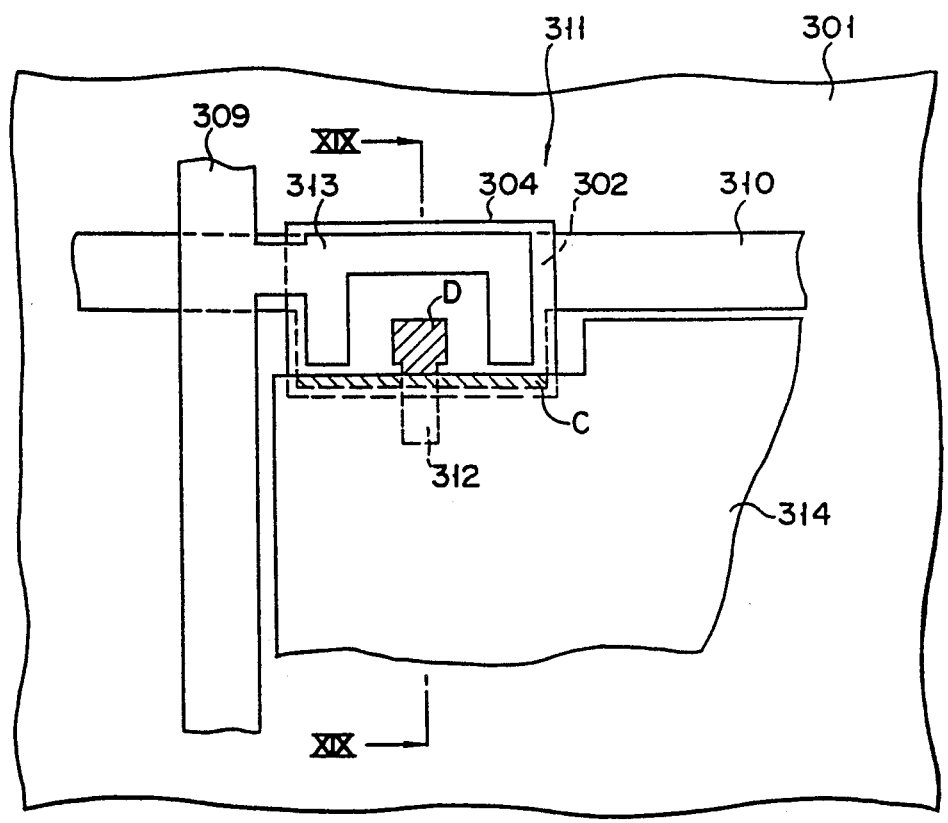
F I G. 18
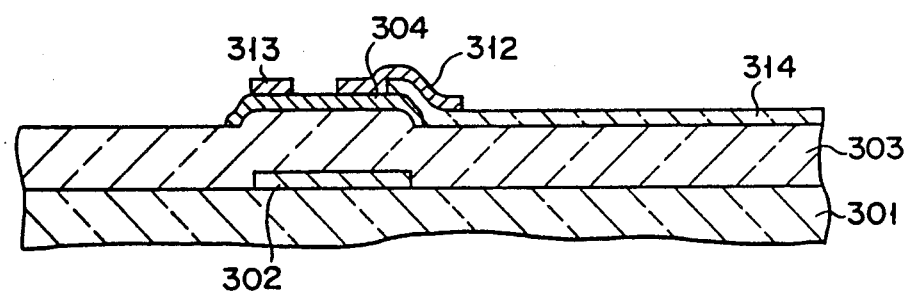
F I G. 19

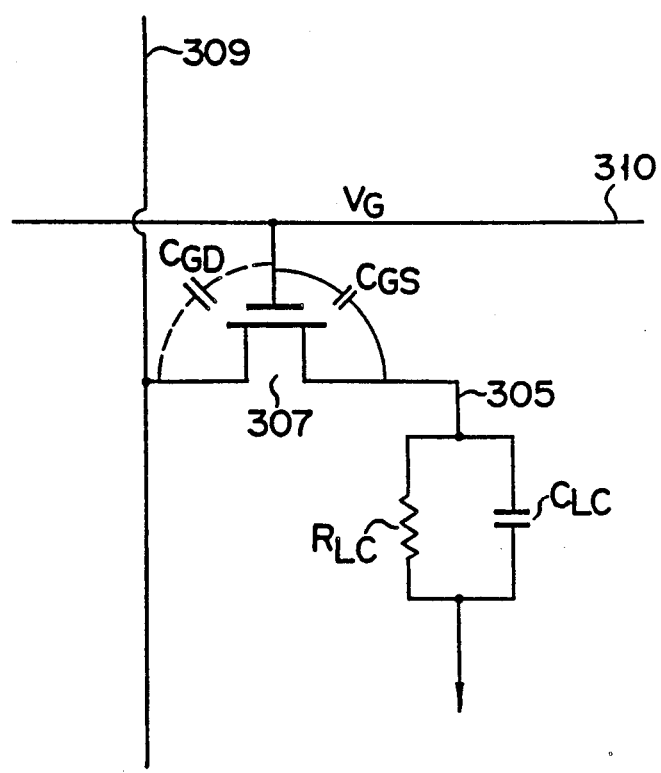
F I G. 20

THIN FILM TRANSISTOR ARRAY

CROSS-REFERENCE TO THE RELATED APPLICATION

This application is a continuation-in-part of application Ser. No. 241,304 filed on Sept. 7, 1988, now abandoned.

BACKGROUND OF THE INVENTION

1. Field of the Invention

The present invention relates to a TFT (Thin Film Transistor) array having a plurality of TFTs arranged in the form of a matrix, and each having a pixel electrode and made by stacking a gate electrode, a semiconductor layer, a source electrode, a drain electrode, and the like, on a transparent insulation substrate.

2. Description of the Related Art

Conventional TFTs as switching elements are disclosed in Published Examined Japanese Utility Model No. 44-5572 (U.S. Ser. No. 132,095), Published Examined Japanese Patent Application No. 41-8172 (U.S. Ser. No. 344,921), and P.K. Weimer, "The TFT—A New Thin-Film Transistor", PROCEEDINGS OF THE IRE, June, 1962. Liquid crystal display panels using such TFTs are disclosed in "A 6×6 Inch 20 lines-Per-Inch Liquid Crystal Display Panel", IEEE Transactions on Electron Device, vol. ED-20, No. 11, Nov. 1973 and U.S. Pat. No. 3,840,695.

On the other hand, U.S. Pat. Nos. 3,765,747 and 3,862,360, and Published Unexamined Japanese Patent Application Nos. 55-32026, 57-20778, and 58-21784 disclose a technique wherein a MOS transistor is formed on a monocrystalline semiconductor substrate, and the resultant structure is used as one of the substrates of a liquid crystal display panel. However, if liquid crystal panels are constituted by these semiconductor substrates, only reflection type displays can be obtained. In addition, the manufacturing process of such panels are as complex as that of LSIs. Moreover, it is difficult to obtain a large display panel.

The above-described active matrix liquid crystal panels, therefore, has TFTs used as switching elements. The structures of these TFTs can be classifield into a coplanar type, an inverted coplanar type, a staggered type, and an inverted staggered type, as disclosed in the article by P.K. Weimer. Of these types, the inverted staggered type TFT can be formed by stacking a plurality of thin films successively in a vacuum. For this reason, the number of manufacturing steps is substantially decreased. As a result, the characteristics of a product are stabilized, and the rate of occurrence of defective transistors is decreased.

FIGS. 1 and 2 show structures of the above-described inverted staggered type TFT and a TFT array obtained by arranging a plurality of such inverted staggered type TFTs on an insulating substrate. Referring to FIGS. 1 and 2, a plurality of TFTs 1 are arranged on a transparent insulating substrate 2 in the form of a matrix. Gate electrodes 3 of TFTs 1 are connected by a gate line 4 extending in the row direction. Drain electrodes 5 of TFTs 1 are connected by a drain line 6 extending in the column direction. A source electrode 7 of each TFT 1 is connected to a transparent electrode 8 independently formed in an area surrounded by the gate and drain lines 4 and 6 (an electrode, to which a data signal is supplied, will be referred to as a drain electrode hereinafter). More specifically, as shown in FIG. 2, the gate electrode 3 consisting of Cr or the like is formed on the transparent glass substrate 2, and a gate insulating film 9 consisting of silicon oxide or silicon nitride is formed on the upper surface of the glass substrate 2 including the upper surface of the gate electrode 3. A semiconductor film 10 consisting of amorphous silicon is stacked on the gate insulating film 9 above the gate electrode 3. Drain and source electrodes 5 and 7 are formed on the semiconductor film 10. They are separated from each other by a predetermined distance, forming channel portion 11. Drain and source electrodes 5 and 7 respectively have contact layers 5a and 7a, and metal layers 5b and 7b, and are electrically connected to the semiconductor 10. The source electrode 7 is connected to the transparent electrode 8 consisting of Indium-Tin-Oxide (to be referred to as an ITO hereinafter).

In the TFT used for the above-described TFT array, since part of the drain electrode 5, the drain line 6, and the transparent electrode 8 are formed on the gate insulating film 9, both the electrodes tend to be short-circuited, and hence the rate of occurrence of defects becomes high. Especially in the TFT array using this TFT, since the transparent electrode 8 is formed in a region surrounded by the gate and drain lines 4 and 6, short-circuiting tends to occur between the transparent electrode 8 and the drain line 6.

In order to prevent such short-circuiting, predetermined distance L determined by process and alignment precision in formation of the transparent electrode 8 and the drain line 6 is formed therebetween. Distance L is usually as along as 20 μm, or more. Although the long distance L can prevent the above-described short-circuiting, the area of the transparent electrode 8 is reduced. That is, the problem of reduction in effective display area is posed. For example, the opening ratio, i.e., the ratio of the area of the transparent electrode 8 to an area for arranging one TFT and one transparent electrode on the glass substrate 2 becomes as small as about 50% even if distance L is reduced to a minimum of 20 μm.

SUMMARY OF THE INVENTION

The present invention has been made to solve the problem described above, and its object is to provide a TFT array in which no short-circuiting occur between the pixel electrodes, on the one hand, and the drain lines, on the other, and which has pixles having a great opening ration.

In order to achieve this object, a TFT array according to the invention comprises:

- a transparent insulating substrate;
- a plurality of gate lines formed on the transparent insulating substrate;
- a plurality of drain lines formed on the transparent insulating substrate and intersecting with the gate lines;
- thin film transistors located at the intersections of the gate lines and the drain lines, each having at least a gate electrode, a semiconductor layer, a source electrode, and a drain electrode;
- an insulating film covering at least the drain electrodes and the drain lines; and
- a transparent electrode electrically connected to the source electrodes and overlapping the gate lines and the drain lines.

In the TFT array, the insulating film is formed on the drain electrodes and the drain lines. Hence, the transparent electrode does not contact the drain electrodes or the drain lines even if it is formed in a large area. In other words, the transparent electrode can be large, thereby to increase the opening ratio of pixels. The TFT array can therefore help to provide a liquid crystal display which has high contrast and bright background.

BRIEF DESCRIPTION OF THE DRAWINGS

FIG. 5 is a partly broken-away perspective view showing a liquid crystal display element comprising the TFT shown in FIG. 3;

FIG. 6 is a partially enlarged view illustrating an array of a plurality of TFTs;

FIG. 7 is a sectional view representing a first modification of the TFT shown in FIG. 3;

FIG. 8 is a sectional view showing a second modification of the TFT shown in FIG. 3;

FIG. 10 is a sectional view of the TFT array, taken along line X—X in FIG. 9;

FIG. 11 is a sectional view illustrating a third modification of the TFT shown in FIG. 3;

FIG. 12 is a sectional view showing a fourth modification of the TFT shown in FIG. 3;

FIG. 13 is a sectional view showing a fifth modification of the TFT shown in FIG. 3;

FIGS. 14A to 14C are sectional views explaining the steps of manufacturing the TFT illustrated in FIG. 13;

FIGS. 15A to 15G are sectional views explaining the steps of manufacturing a TFT array according to the present invention;

FIG. 18 is a plane view illustrating an other type of a TFT for use in the present invention;

FIG. 19 is a sectional view showing the TFT illustrated in FIG. 18, taken along line XIX—XIX in FIG. 18; and FIG. 20 is an equivalent circuit diagram of a liquid crystal display element comprising the TFTs shown in FIGS. 16 and 18.

DETAILED DESCRIPTION OF THE PREFERRED EMBODIMENTS

A TFT for use in the invention, which is an inverted staggered TFT having a pixel electrode, will now be descried with reference to the accompanying drawings.

Figure 3:
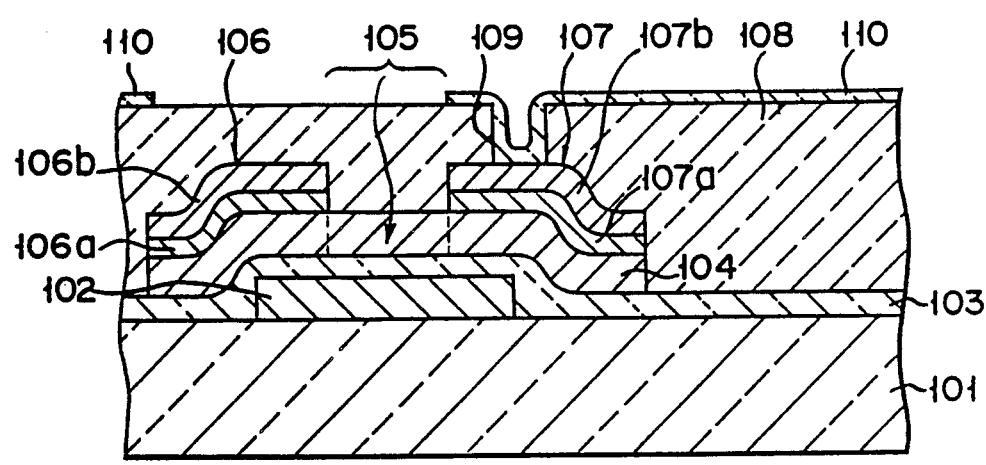
FIG. 3 is a sectional view showing an inverted staggered TFT having a pixel electrode formed on the upper surface.

FIG. 3 is a sectional view illustrating the inverted staggered TFT. Electrode 102 consisting of Cr and having a thickness of about 1,000 Å is formed on a insulating substrate 101 consisting of a transparent glass plate. A gate insulating film 103 made of silicon nitride or silicon oxide and having a thickness of about 3,000 Å is formed on the upper surface of the insulating substrate 101 including the upper surface of the gate electrode 102. A semiconductor film 104 consisting of amorphous silicon and having a thickness about 1,000 Å is formed on the gate insulating film 103, covering a portion above the gate electrode 102 and its peripheral portion. Drain and source electrodes 106 and 107 are formed on the semiconductor film 104. They are separated from each other by a predetermined distance, thus forming a channel portion 105. In order to electrically connect the drain and the source electrodes 106 and 107 to the semiconductor film 104, the electrodes 106 and 107 are respectively constituted by the contact films 106a and 107a, each made of amorphous silicon doped with an impurity in a high concentration and having a thickness of about 500 Å, conductive layers 106b and 107b, each made of a conductive metal material such as Cr and having a thickness of about 1,000 Å. In addition, a transparent insulating film 108 made of $SiO_2$, polyimide, or an acrylic resin is deposited on substantially the entire exposed surface above the insulating substrate 101 on which the above-described films are stacked in a predetermined form. The drain electrode 106 is covered with the insulating film 108 and insulated from other electrodes. The thickness of the insulating film 108 on the drain and the source electrodes 106 and 107 is about 3,000 Å. The insulating film 108 fills recesses generated upon formation of the above thin films, thereby smoothening the surface above the insulating substrate 101. A through hole 109 extending through the insulating film 108 is formed in a portion the of insulating film 108 above the source electrode 107. In addition, a transparent electrode 110 consisting of ITO and having a thickness of about 1,000 Å is formed on the upper surface of the insulating film 108. The transparent electrode 110 extends into the through hole 109 and hence is electrically connected to the source electrode 107. A portion of the transparent electrode 110 above a channel portion 105 of the semiconductor film 104 formed between the drain and the source electrodes 106 and 107, and its portion above the drain electrode 106 is mostly removed. That is, the transparent electrode 110 above the channel portion 105 must be removed so as to prevent an unnecessary electric field from being applied to the channel portion 105. Furthermore, in order to decrease a parasitic capacitance, the transparent electrode 110 is formed above the drain electrode 106, with its edge slightly overlapping the edge of the drain electrode 106. Note that since the parasitic capacitance is small, the transparent electrode 110 may overlap the drain electrode 106. If the thickness of the insulating film 108 formed on the drain and the source electrodes 106 and 107 is excessively small, the insulation property is degraded. In contrast to this, if it is excessively large, connection to the transparent electrode through through hole 109 formed on the source electrode 107 will be difficult. For this reason, the thickness of insulating film 108 preferably falls within the range of 2,000 to 8,000 Å.

In the TFT having the above structure, since the insulating film 108 is formed at least on the drain electrode 106, the probability of short-circuiting between the drain and the source electrodes 106 and 110 is considerably decreased. In addition, since the transparent electrode 110 is not present above the channel portion 105 of the semiconductor film 104, an unnecessary electric field is not applied to the channel portion 105, and hence the TFT can be stably operated.

With reference to FIGS. 4A to 4F, it will now be explained how the TFT shown in FIG. 3 is manufactured.

Figure 4A:
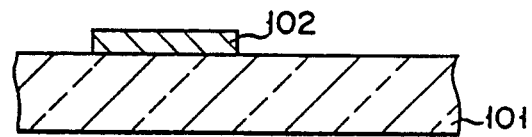
FIGS. 4A and 4F are sectional views explaining the steps of manufacturing the TFT shown in FIG. 3.

As shown in FIG. 4A, a metal film having a thickness of, e.g., about 1,000 Å is deposited by means of sputtering or vapor deposition on the transparent insulating substrate 101 having a cleaned surface. The metal film is patterned by photolithography or the like to form the gate electrode 102. The insulating substrate 101 may consist of glass, quartz, sapphire, or the like. The gate electrode 102 consists of chromium, titanium, tungsten, tantalum, copper, or the like.

Figure 4B:
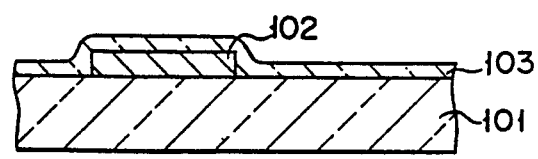
Figure 4C:
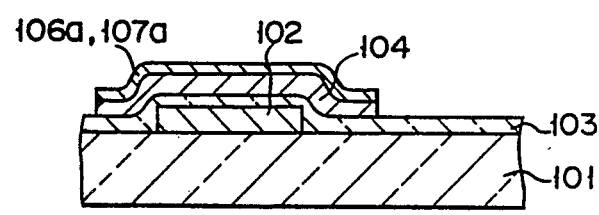

As shown in FIG. 4B, the gate insulating film 103 is then formed on the entire surface of the insulating substrate 101 by plasma CVD or the like so as to have a thickness of, e.g., 3,000 Å and cover the gate electrode 102. A silicon nitride (SiN) film, silicon oxide ($SiO_2$) film, or the like is used as the gate insulating film 103. Subsequently, as shown in FIG. 4C, the semiconductor film 104 made of amorphous silicon (a-i-Si) or the like and the contact film 106a (107a) made of amorphous silicon (a-n+-Si) which is doped with an impurity at high concentration are continuously formed/stacked by plasma CVD or the like on the gate insulating film 103 so as to have thicknesses of, e.g., 1,000 Å and 500 Å, respectively. The semiconductor film 104 and the contact film 106a (107a) are patterned by photolithography or the like so as to cover a portion above the gate electrode 102 and its peripheral portion. Instead of the above amorphous silicon, amorphous silicon carbide (SiC), tellurium, selenium, gerumanium, cadmium sulfide (CdS), cadmium selenide (CdSe), or the like may be used as a material for semiconductor film 104 and contact film 106a (107a).

Figure 4D:
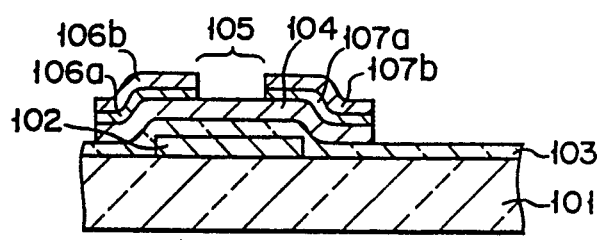

A 1,000-Å thick metal film is then formed on the entire surface above the insulating substrate 101 by vapor deposition, sputtering, or the like, thus covering the contact film 106a (107a). The metal film is patterned by photolithography or the like to remove the contact film 106a (107a) above the channel portion 105, thereby forming the drain and the source electrodes 106 and 107 above the gate electrode 102, which are separated from each other by a predetermined distance, as shown in FIG. 4D. Chromium, titanium, tungsten, tantalum, copper, or the like is used as a material for the metal films 106b and 107b of the drain and the source electrodes 106 and 107.

Figure 4E:
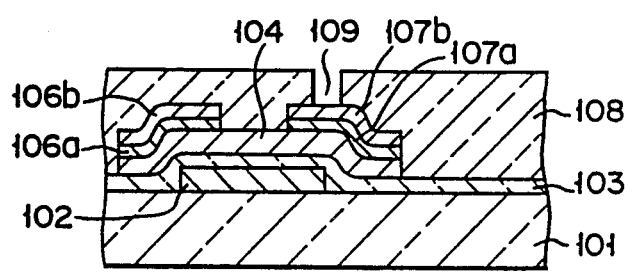

As shown in FIG. 4E, the transparent insulating film 108 is formed above the insulating substrate 101, covering at least the drain electrode 106 and smoothening the surface. As the transparent insulating film 108, an organic insulating film obtained by coating and baking polyimide or an acrylic resin using a spin coat method, or an $SiO_2$ inorganic insulating film (SOG film) obtained by spuin-coating and baking a silanol compound. The thickness of the transparent insulating film 108 on the drain electrode 106 is about 3,000 Å. Subsequently, the through hole 109 is formed in the transparent insulating film 108 above the source electrode 107 by etching.

Figure 4F:
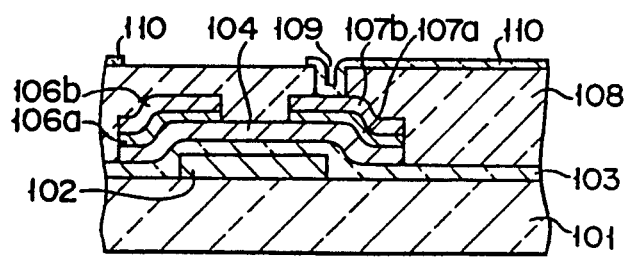

Finally, as shown in FIG. 4F, a transparent conductive material such as ITO, tine oxide ($SnO_2$), or indium oxide ($In_2O_3$) is sputtered on the surface of the transparent insulating film 108 including the through hole 109 to a thickness of about 1,000 Å. Then, portions of this transparent conductive material above the channel portion 105 of the semiconductor film 104 and overlapping the drain electrode 106 through the transparent insulating film 108 are removed. With the above process, fabrication of the TFT is completed.

According to the above-described manufacturing method, since the step of forming the transparent electrode 110 in which a defect generally tends to occur becomes the last step, even if a defect occurs in this step, the immediately preceding step can be repeated, thereby reducing the ratio of occurrence of defects.

As shown in FIGS. 5 and 6, a plurality of TFTs of FIG. 3 are arranged on a transparent insulating substrate in the form of a matrix, and are used as a liquid crystal display device. More specifically, a plurality of TFTs 111 are arrayed on a transparent insulating substrate 112 in the column and the row directions. Gate electrodes 102 of the respective TFTs are commonly connected to gate line 113 in the row direction. Drain electrodes 106 of the respective TFTs are commonly connected to drain line 114 in the column direction. Source electrodes 107 of TFTs 111 are connected to transparent electrodes 110, which are substantially formed into squares, through through holes 109. Transparent electrodes 110 are respectively arranged in a plurality of regions surrounded by the gate and the drain lines 113 and 114, and are electrically independent from each other. The edges of each transparent electrode 110 are located near the gate and the drain lines 113 and 114, or slightly overlap them. The above-described sectional structure shown in FIG. 3 corresponds to a sectional structure taken along line III—III in FIG. 6.

An opposite transparent substrate 116 having a transparent electrode 115 formed on its entire surface is placed on the substrate on which TFTs 111 are arranged in the form of a matrix in the above-described manner so as to oppose it. A liquid crystal display device is obtained by sealing liquid crystal 117 between these substrates. In this liquid crystal display device, one transparent electrode 110 is a pixel electrode corresponding to one pixel for image display. These pixel electrodes do not overlap the channel portions of the TFTs connected to the adjacent pixel electrodes, and areas where the pixel electrodes overlap the corresponding drain electrodes are minimized.

The above-described liquid crystal display device is operated in the following manner. Scan signals are sequentially supplied to a plurality of the gate lines 113. Data signals for controlling the ON/OFF states of the respective pixels are supplied to a plurality of the drain lines 114 in accordance with the timings of the scan signals. TFT 111 whose gate electrode 102 has received a scan signal is turned on, reads a data signal supplied at that timing, and supplies it to the pixel electrode 110. An electric field is applied to the liquid crystal 117 located between the pixel electrode which has received the data signal and the transparent electrode 115 of the opposite substrate 116 in accordance with a potential difference between the opposite electrodes. Then, the orientation state of the molecules of the liquid crystal 117 is changed, and thus transmission and interception of light are controlled.

Figure 1:
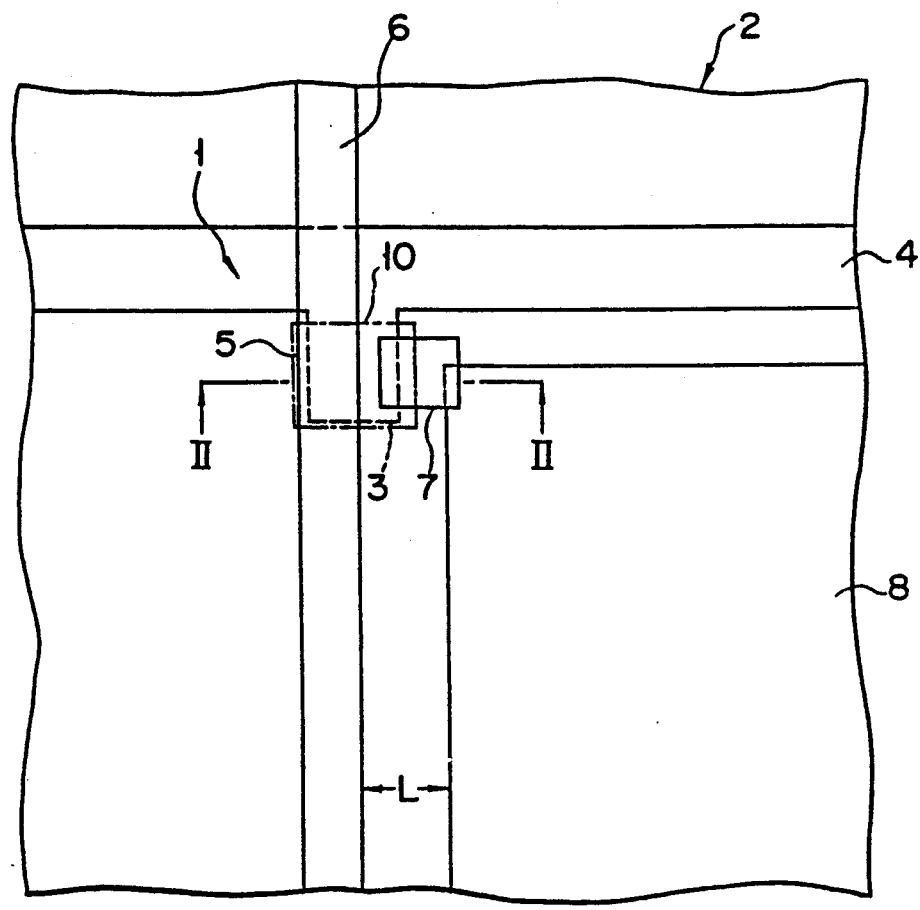
FIG. 1 is a plan view showing a conventional TFT.
Figure 2:
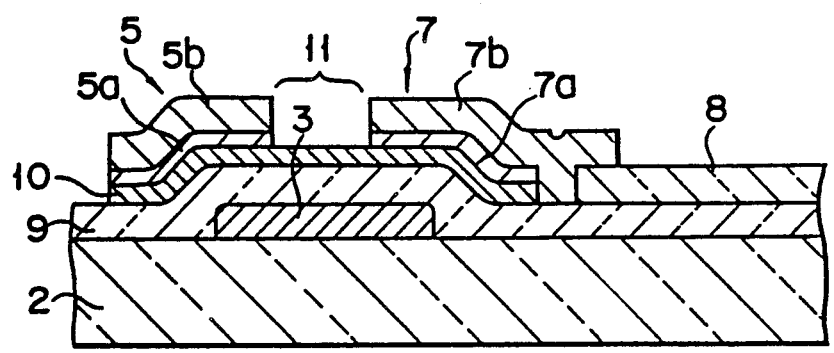
FIG. 2 is a sectional view illustrating the TFT, taken along line II—II in FIG. 1.

As described above, in the liquid crystal display having pixel electrode formed on TFTs, the transparent insulating film 108 is formed o at least the drain electrode 106 of the TFT, and the transparent electrode 110 is formed on the resultant structure. Therefore short-circuiting between the transparent electrode 110 and the drain electrode 106 can be prevented. In addition, the distance between the transparent electrode 110 and the drain electrode 106, i.e., distance L in FIG. 1, can be set to be zero. Moreover, the transparent electrode 110 may be arranged so as to overlap the drain and the gate lines 114 and 113. With this arrangement, the entire region except for an opaque region (the semiconductor film 104, the source and the drain electrodes 107 and 106, and the gate and the drain lines 113 and 114) can be made an effective display area, and hence a maximum effective display area can be obtained. According to the embodiment, an opening ratio of 70% can be realized (50% in the conventional device). Since the step of forming the transparent electrode is the last one, and the source electrodes of all the TFTs are commonly connected upon deposition of the transparent conductive film before the step of separating the transparent conductive film individually is executed operations of all the TFTs can be measured within a short period of time by bringing the probe of a measuring device into contact with a plurality of the gate and the drain lines 113 and 114, and the transparent conductive film and supplying test signals.

Modifications of the TFT shown in FIG. 3 will be described with reference to FIGS. 7 and 8. The same reference numerals in these drawings denote the same parts as FIG. 3, and a description thereof will be omitted.

FIG. 7 illustrates the first modification of the TFT shown in FIG. 3. A first and a second insulating films 108a and 108b are deposited to cover a drain and a source electrodes 106 and 107, and a transparent electrode 110 is formed on the resultant structure. The first insulating film 108a is an SiO$_2$ film obtained by dissolving a silanol compound in a solvent, coating the resultant solution by a spin coat method, and baking the coated film. The first insulating film 108a is used to flatten the uneven surface above an insulating substrate. The second insulating film 108b is a nitride film obtained by chemical vapor deposition (CVD), and is used to improve an insulation property. In the first modification of the TFT, the surface above a insulating substrate 101 can be reliably smoothened, and the insulation property and the like can be reliably protected.

FIG. 8 illustrates the second modification of the TFT shown in FIG. 3. A transparent electrode 110 is formed without flattening the surface above an insulating substrate 101. An insulating film 118 is formed on only a channel portion 105 and a drain electrode 106 so as to protect the channel portion 105 and insulate the drain electrode 106 from the transparent electrode 110. Accordingly, the transparent electrodes 110 of one TFT and an adjacent TFT are not present above the channel portion 105, and the area where the transparent electrode 110 overlaps the drain electrode 106 is small. Therefore, short-circuiting between the transparent electrode 110 and the drain electrode 106 does not occur, and an electric field is not applied from the transparent electrode 110 to the channel portion 105.

The TFT shown in FIG. 8 has the insulating film 118 formed on the channel portion 105 and the drain electrode 106 only. In this TFT, the transparent electrode 110 cannot be so large as is desired. If the electrode 110 is made so large, it will contact the drain line (not shown in FIG. 8). This is why the insulating film 118 is formed on the portion 105 and the electrode 106 only. Obviously, the transparent electrode 110 is not so large, and the opening ratio of the pixel is not so great. Hence, when the TFT shown in FIG. 8 is incorporated into a liquid crystal display, the display will have but an insufficient contrast and a dark background.

A TFT array, whose pixels have a sufficient opening ratio and which can therefore help to provide a liquid display having high contrast, will now be described with reference to FIGS. 9 and 10.

Figure 9:
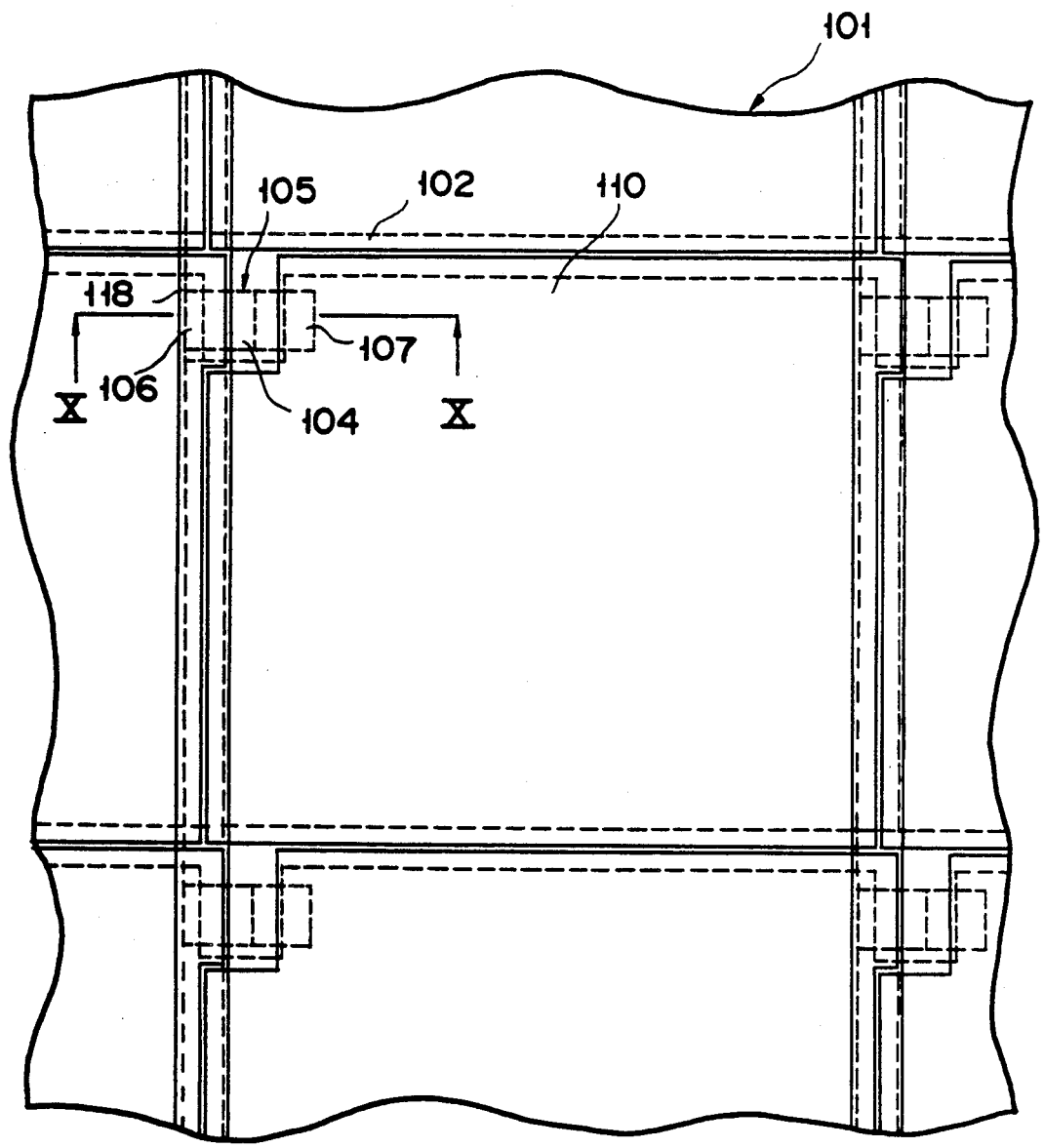
FIG. 9 is a plan view showing a TFT array according to the present invention.

FIG. 9 is a plan view of a TFT panel comprising the TFT array according to the present invention, and FIG. 10 is a sectional view of the TFT array, taken along line X—X in FIG. 9. In FIGS. 9 and 10, the same reference numerals are designate the same components as those shown in FIG. 8. The components identidal to those shown in FIG. 8 will now be described in detail.

As is illustrate in FIGS. 9 and 10, gate lines 102 (i.e., gate electrodes) are formed on a substrate 101, and a gate insulating film 103 is formed on the gate lines 102 and also on the substrate 101. Further, a semiconductor layer 104 is formed on the gate insulating film 103, and a drain electrode 106 and a source electrode 107 are formed on the semiconductor layer 104. As far as these structual features are concerned, the TFTs shown in FIGS. 9 and 10 are identical to the TFT illustrated in FIG. 8. Nevertheless, it differs in two respects. First, the insulating film 118 covers the entire drain line 106 including the drain electrode), whereas in the TFT of FIG. 8, the film 118 is formed only on the channel portion 105 and the drain line 106. Second, a transparent electrode 110 overlaps the insulating film 118 formed on the drain line 106. As is best shown in FIG. 10, the insulating film 118 covers the drain electrode 106, and the transparent electrode 110 is formed on the insulating film 118.

Since the insulating film 118 is formed on the drain line 106, the transparent electrode 110 overlaps the drain line 106, too. Hence, the pixel has a great opening ratio. When the TFT panel of FIG. 9 is incorporated into a liquid crystal display, the display will have a high contrast and a bright background.

As is evident from FIG. 9, the transparent electrode 110 overlaps the gate line 102. However, the electrode 110 does not contact the gate line 102 since, as is shown in FIG. 10, the gate insulating film 103 is formed on the entire surface of the substrate 101. The insulating film 118 is not formed on a channel portion 105, but there arise no problems at all even if the film 118 is formed on the channel portion 105.

FIG. 11 shows the third modification of the TFT shown in FIG. 3. A contact metal 119 consisting of a conductive metal material is buried in a through hole 109 formed above a source electrode 107, and a transparent electrode 110 is deposited on the resultant structure, thereby electrically connecting the source electrode 107 to the transparent electrode 110. The contact metal 119 consists of nickel, gold, silver, chromium, or the like, and is formed in the through hole 109 by electroless plating. In the third modification, the source and the transparent electrodes 107 and 110 are connected to each other through the contact metal 119. Hence electrical connection therebetween can be ensured.

FIG. 12 shows the fourth modification of the TFT shown in FIG. 3. A contact metal 120 consisting of chromium, copper, aluminum, or the like is stacked on a transparent electrode 110, which is electrically connected to a source electrode 107, formed in a through hole 109 of a transparent film 108. In this modification electrical connection between the source and the transparent electrodes 107 and 110 can be ensured.

FIG. 13 shows the fifth embodiment of the TFT shown in FIG. 3. A shield film 121 is formed above a contact metal 120, a channel portion 105, and a drain electrode 106 shown in the fourth modification so as to prevent a decrease in OFF resistance of the TFT due to radiation of external light onto the channel portion 105.

The contact metal 120 and a shield film 121 in the fifth modification are formed in the following manner. As shown in FIG. 14A a transparent electrode film made of ITO and having a thickness of 500 to 1,000 Å and a metal conductive film 120a consisting of chromium, copper, or aluminum and having a thickness twice the depth of a through hole 109, e.g., about 6,000 Å are continuously stacked on the surface above a insulating substrate 101 including a transparent insulating film 108 and the through hole 109, and parts of the stacked films above the channel portion 105 and on a drain electrode 106 are removed. Subsequently, as shown in FIG. 14B, a shield material consisting of a transparent and insulating resin or a metal oxide is stacked on the resultant structure. Then, the shield material is etched so as to be left on regions including a region above the through hole 109 of the metal conductive film 120a and a region above the channel portion 105, thereby forming a shield film 121. After this process, as shown in FIG. 14C the metal conductive film 120a is etched by using the shield film 121 as a resist to remove the metal conductive film 120a from the surface of the transparent electrode 110, thereby forming the contact metal 120 on the through hole 109.

In the fifth modification, the contact metal 120 is patterned by using the shield film 121 as a resist. The contact metal 120 can, therefore be formed substantially without increasing the number of steps in manufacturing.

It will now be described how a TFT of a different structure is manufactured. FIGS. 15A to 15G show the steps of manufacturing this TFT. FIG. 15G shows a finished TFT. As shown in FIG. 15G, in the TFT, a gate electrode 202, a gate insulating film 203, and a semiconductor film 204 are stacked on a transparent insulating substrate 201 and formed into the same shape. A contact films 206 each consisting of a semiconductor layer having a high impurity concentration, an ohmic contact electrodes 207, and a metal electrodes 209, all pairs of 15 which have the identical shapes, are formed on the semiconductor film 204 and separated from each other by a predetermined distance to form a channel portion 205. A drain and a source electrodes 211 and 210 are respectively constituted by the contact films 206, the ohmic contact electrodes 207, and metal electrodes 209. A transparent insulating film 208 is formed on a portion outside the stacked thin films to the height of the ohmic contact electrode 207. In addition, a pixel electrode 212 is formed on the transparent insulating film 208 so as to be in contact with the metal electrode 209 of the source electrode 210.

The TFT having the above-described arrangement is manufactured in the following manner. As shown in FIG. 15A a metal film 202a consisting of chromium (Cr), molybdenum (Mo), tungsten (W), or the like is deposited on a cleaned surface of the transparent insulating substrate 201 to a thickness of, e.g., 1,000 Å by sputtering, vapor deposition, or the like. An insulating film 203a made of silicon nitride (SiN) or the like is deposited on the metal film 202a to a thickness of, e.g., about 3000 Å by plasma CVD or the like. Subsequently, an amor-phous silicon (a-i-Si) film 204a and a n+-type amorphous silicon (a-n+-Si) film 206a doped with a high-concentration impurity are respectively deposited on the resultant structure to thicknesses of, e.g., about 1,000 Å and 500 Å by plasma CVD or the like. In addition, an ohmic contact film 207a consisting of Cr, Ti, a noble metal silicide such as PTSi or PT2Si, or the like for an ohmic contact is deposited on the n+-type amorphous silicon 206a by sputtering or the like. The steps of stacking/forming the metal film 202a, the insulating film 203a, the amorphous silicon 204a, the n+-type amorphous silicon 206a, and ohmic contact film 207a on the transparent insulating substrate 201 are continuously performed by sputtering and plasma CVD.

As shown in FIG. 15B, the ohmic contact film 207a, the n+-type amorphous silicon 206a, the amorphous silicon 204a, the insulating film 203a, and the metal film 202a are etched to form the gate electrode 202, a gate line (not shown) for supplying scan signals to the gate electrode 202, the gate insulating film 203, the semiconductor film 204, the contact film portion 206b, and the ohmic contact electrode film 207b. The ohmic contact film 207a, the n+-type amorphous silicon the 206a, amorphous silicon 204a, the insulating film 203a, and the metal film 202a are continuously etched by, e.g., reactive etching. Alternatively, the n+-type amorphous silicon 206a, the amorphous silicon 204a, the insulating film 203a may be etched by plasma etching, the and metal film 202a may be etched by wet etching. Then, as shown in FIG. 15C, the transparent insulating flattening film 208 consisting of a silica film or an organic substance such as acrylic is coated above the transparent insulating substrate 201 to a height substantially equal to that of the ohmic contact electrode film 207b by a spin coating method.

If the flattening film 208 is also coated on the ohmic contact electrode film 207b upon coating, the flattening film 208 on the film 207b is removed by etch back.

In addition, a metal film 209a having a small specific resistance, such as an aluminum (Al), copper (Cu), or silver (Ag) film, is deposited on the entire surfaces of the ohmic contact electrode film 207b and the flattening film 208 above the transparent insulating substrate 201 by sputtering, vapor deposition, or the like. Then, as shown in FIG. 13E, the corresponding position of the channel portion 205 of the metal film 209a, the ohmic contact metal film 207b, and the contact film portion 206b is continuously etched respectively by photolithography to form the drain and the source electrodes 211 and 210 each consisting of the metal electrode 209, the ohmic contact electrode 207, and the contact film 206, and to form a drain line for supplying image signals to the drain electrode 211.

Figure 15E:
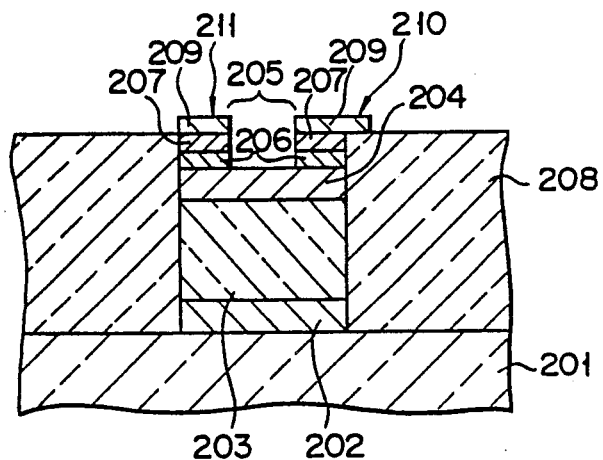
Figure 15F:
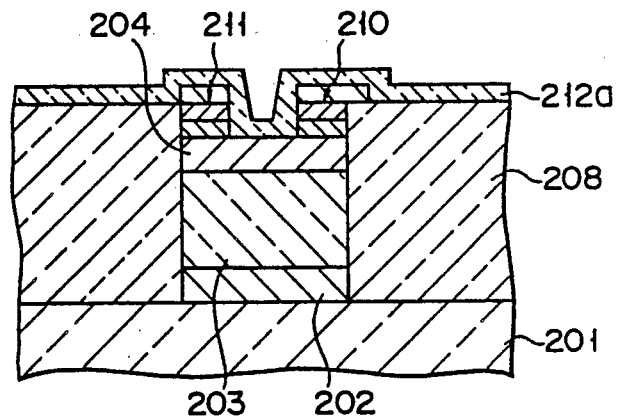
Figure 15G:
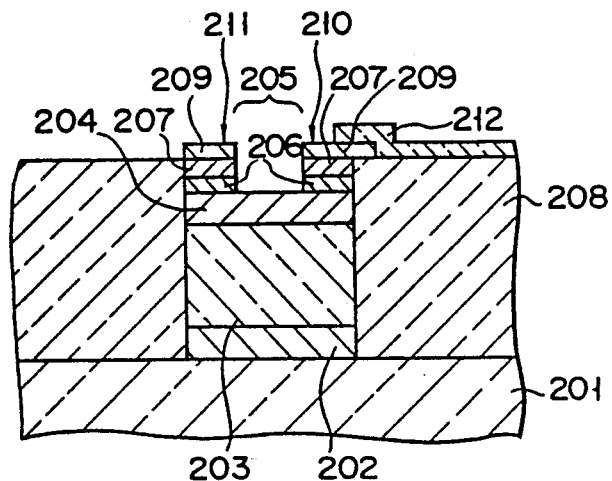

Subsequently, as shown in FIG. 15F, a transparent conductive film 212a such as an ITO film is deposited on the entire surface above the transparent insulating substrate 201 by vapor deposition or the like.

Finally, as shown in FIG. 15G, a pixel electrode 212 is formed by photolighography or the like. With this process, a TFT active matrix panel is completed. In the TFT of this embodiment, since the gate electrode 202, the gate insulating film 203, the semiconductor film 204, the contact film 206, and the ohmic contact electrode 207 can be successively formed in a series of steps, stable characteristics can be obtained. Since the stacked films obtained by the above-described series of steps are continuously etched, the number of steps is decreased.

Figure 16:
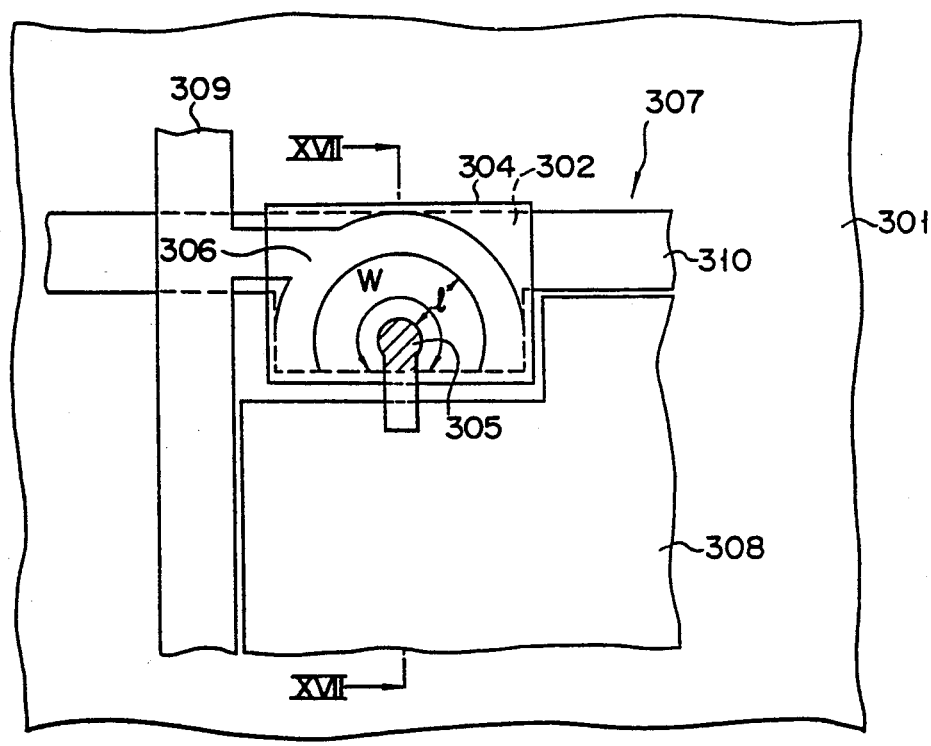
FIG. 16 is a plan view showing the structure of another type of a TFT for use in the present invention.
Figure 17:
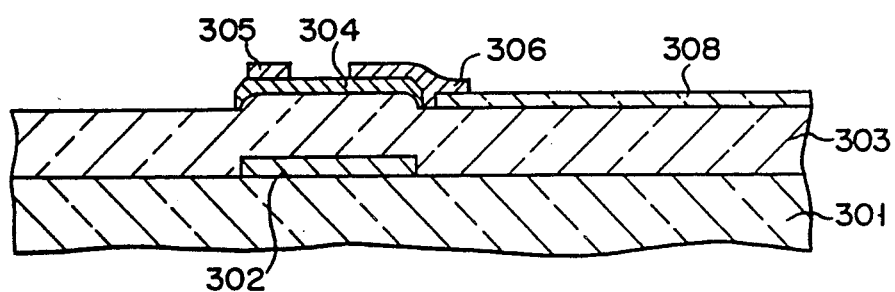
FIG. 17 is a sectional view showing the TFT shown in FIG. 16, taken along line XVII—XVII in FIG. 16.

A structure of another TFT will be described below. FIGS. 16 and 17 show this TFT. More specifically, a gate electrode 302 is formed on a glass substrate 301, and a gate insulating film 303 consisting of silicon nitride and having a thickness of about 3,000 Å is stacked on the gate electrode 302. A semiconductor film 304 consisting of amorphous silicon is stacked on part of the gate insulating film 303, which corresponds to the gate electrode 302. A circular source electrode 305 is formed on the semiconductor film 304. The source electrode 305 has a diameter of, e.g., about 4 μm. A drain electrode 306 is formed in an annular shape on the semiconductor film 304 substantially concentrically with the source electrode 305, thereby forming a semiconductor channel portion in a partial annular shape between the two electrodes. Since the channel portion is formed so as to surround the source electrode 305, if the distance between the two electrodes is a channel length l, and the length of an arc defined by substantially intermediate points of the channel length l is a channel width W, the channel width W is sufficiently larger than the channel length l. Ratio l/W of the channel length l to the channel width W is one or less.

A plurality of TFTs 307 each arranged in the above-described manner are arrayed on the substrate 301 in the form of a matrix. The source electrode 305 of TFT 307 is connected to a pixel electrode 308 consisting of a transparent conductive substance. Drain electrodes 306 of TFTs 307 arranged in the column direction are commonly connected to a drain line 309. The gate electrodes 302 of TFTs 307 arranged in the row direction are commonly connected to a gate line 310. In addition, a plurality of pixel electrodes 308 connected to source electrodes of TFTs 307 are arrayed above the glass substrate 301 in the form of a matrix.

In TFT 307, the source electrode 305 is formed so as to be smaller than the drain electrode 306. Therefore, the area where the source and the gate electrodes 305 and 302 overlap each other is considerably smaller than that where the drain and the gate electrodes 306 and 302 overlap each other. As indicated by an equivalent circuit diagram in FIG. 20, gate-source capacitance CGS present between the gate and the source electrodes 302 and 305 is very small. If, for example, the source electrode 305 is a circular electrode having a diameter of 4 μm, and the gate insulating film 303 has a thickness of 3,000 Å as is the case with this embodiment, a gate-source capacitance $C_{GS}$ is as small as about 0.003 PF. Assuming that an equivalent capacitance $C_{LC}$ between two electrodes opposing each other through the pixel electrode 308 and a corresponding liquid crystal is set to be 0.1 PF (in a case wherein the area of the pixel electrode 308 is 100 μm × 100 μm), then a voltage drop ΔV across the source electrode 305 can be represented by:

$$\Delta V = \{C_{GS}/(C_{GS}+C_{LS})\} \cdot V_G = \{0.003/(0.003+0.1)\} \cdot V_G$$

This voltage drop is as small as about 3% of gate voltage $V_G$. As described above, since the area of the source electrode 305 is made small in this TFT, the gate-source capacitance $C_{GS}$ can be made small compared with the capacitance generated between one pixel electrode and an electrode opposing the pixel electrode through a liquid crystal. Therefore, the influences of gate signals on source potentials can be reduced, and the pixel electrode 308 can be micropatterned. In addition, since the drain electrode 306 is formed so as to surround the source electrode 305, the channel width can be increased, and high drive performance of a thin film transistor can be realized.

A structure of a TFT according to still another embodiment will be described with reference to FIGS. 18 and 19. Since the fundamental structure of this TFT is the same as that of the TFT in FIGS. 16 and 17, the same reference numerals in FIGS. 18 and 19 denote the same parts as in FIGS. 16 and 17, and a description thereof will be omitted. Referring to FIGS. 18 and 19, a source electrode 312 of TFT 311 has a rectangular shape. U-shaped a drain electrode 313 is formed so as to surround rectangular the source electrode 312. Similarly, in TFT 311, the area of the source electrode 312 is made small, and hence the area where the source and the gate electrodes 312 and 302 overlap each other is small. Therefore, a gate-source capacitance $C_{GS}$ between the gate and the source electrodes 302 and 312 is small, and the influence of a gate signal on a source potential is small. In addition, since a drain electrode 313 is formed so as to surround the source electrode 312, a channel width can be set to be sufficiently large.

Furthermore, in order to increase the opening ratio by increasing the area of a pixel electrode 314 as much as possible, the pixel electrode 314 is extended so that partially overlaps the gate electrode 302 as indicated by cross-hatched portions in FIG. 18. In this case, the gate-source capacitance $C_{GS}$ between the gate and the source electrodes 302 and 312 is determined by the sum of areas D and C where the gate and the source electrodes 302 and 312, and the gate and the pixel electrodes 312 and 314 overlap each other, as indicated by the cross-hatched portions in FIG. 18. Therefore, area C where the gate and the pixel electrodes 302 and 314 overlap each other, and area D where the gate and the source electrodes 302 and 312 overlap each other are determined such that gate-source capacitance $C_{GS}$ determined by areas C and D becomes sufficiently small compared with an equivalent capacitance $C_{LC}$ between one pixel electrode 314 and a electrode opposing the pixel electrode 314 through a liquid crystal.

Note that the source and the drain electrodes 312 and 313 may be formed into polygonal shapes without an acute angle, such as a pentagon and a hexagon, or elliptical shapes.

What is claimed is:

1. A TFT array comprising:
   a transparent insulating substrate;
   a plurality of gate lines formed on said transparent insulating substrate;
   a plurality of drain lines formed on said transparent insulating substrate and intersecting with said gate lines;
   thin film transistors located at the intersections of said gate lines and said drain lines, each having at least a gate electrode, a semiconductor layer, a source electrode, and a drain electrode;
   an insulating film covering at least said drain electrodes and said drain lines; and
   a transparent electrode electrically connected to said source electrodes and overlapping said gate lines and said drain lines.

2. The TFT array according to claim 1, wherein said transparent electrode is a pixel electrode.

3. The TFT array according to claim 1, wherein said source electrodes are directly connected to said transparent electrode electrically.

* * * * *

UNITED STATES PATENT AND TRADEMARK OFFICE
CERTIFICATE OF CORRECTION

PATENT NO. : 5,003,356

DATED : March 26, 1991

INVENTOR(S) : WAKAI et al

It is certified that error appears in the above-identified patent and that said Letters Patent is hereby corrected as shown below:

TITLE PAGE:

Section [56] References Cited, under "FOREIGN PATENT DOCUMENTS", change the Japanese references -

"16-8172" to --41-8172--

"19-5572" to --44-5572--.

Signed and Sealed this

Sixteenth Day of February, 1993

Attest:

STEPHEN G. KUNIN

*Attesting Officer*   *Acting Commissioner of Patents and Trademarks*